(12) United States Patent
Uchida et al.

(10) Patent No.: US 8,313,637 B2
(45) Date of Patent: Nov. 20, 2012

(54) ELECTROLYSIS METHOD

(75) Inventors: Minoru Uchida, Tokyo (JP); Tatsuo Nagai, Tokyo (JP); Shunichi Kanamori, Tokyo (JP)

(73) Assignee: Kurita Water Industries Ltd. (JP)

( * ) Notice: Subject to any disclaimer, the term of this patent is extended or adjusted under 35 U.S.C. 154(b) by 130 days.

(21) Appl. No.: 12/934,194

(22) PCT Filed: Dec. 26, 2008

(86) PCT No.: PCT/JP2008/073760
§ 371 (c)(1),
(2), (4) Date: Sep. 23, 2010

(87) PCT Pub. No.: WO2009/087931
PCT Pub. Date: Jul. 16, 2009

(65) Prior Publication Data
US 2011/0017606 A1 Jan. 27, 2011

(30) Foreign Application Priority Data
Jan. 11, 2008 (JP) ................................. 2008-004529

(51) Int. Cl.
*B01D 59/40* (2006.01)
*C02F 1/461* (2006.01)
*C25F 1/00* (2006.01)

(52) U.S. Cl. ........ 205/723; 205/714; 205/712; 205/705; 205/742; 205/770; 205/465; 205/471; 205/554; 205/555

(58) Field of Classification Search .................. 205/554, 205/705, 712, 714, 723, 742, 770, 555, 465, 205/471
See application file for complete search history.

(56) References Cited

U.S. PATENT DOCUMENTS

| 5,523,518 A | * | 6/1996 | Shikami et al. | ............... 205/770 |
|---|---|---|---|---|
| 5,900,127 A | * | 5/1999 | Iida et al. | ................. 204/290.08 |
| 8,211,287 B2 | * | 7/2012 | Kato et al. | .................... 205/472 |
| 2004/0206624 A1 | * | 10/2004 | Hosonuma et al. | ........... 204/294 |

FOREIGN PATENT DOCUMENTS

| JP | 11-224831 | 8/1999 |
|---|---|---|
| JP | 2006-114880 | 4/2006 |

OTHER PUBLICATIONS

Ryoichi Matsuda, et al., The Electrolytic Formation of Persulphate, Part II, Bulletin of the Chemical Society of Japan, vol. 11, No. 10, 1936, pp. 650-659.

* cited by examiner

*Primary Examiner* — Bruce Bell
(74) *Attorney, Agent, or Firm* — Baker & Hostetler LLP

(57) ABSTRACT

A wear of an electrode is prevented as much as possible, thereby efficiently electrolyzing a sulfuric acid solution and the like. An electrolysis method includes: passing an electrolytic solution through an electrolysis cell including at least a pair of an anode and a cathode; and supplying the electrodes with an electric power, so as to electrolyze the electrolytic solution, wherein a viscosity of the electrolytic solution is set in a range in response to a current density upon the electric power supply to carry out the electrolysis. The viscosity of a sulfuric acid solution as the electrolytic solution is equal to or less than 10 cP when the current density is equal to or less than 50 A/dm$^2$, the viscosity of the sulfuric acid solution is equal to or less than 8 cP when the current density is from more than 50 to 75 A/dm$^2$, and the viscosity of the sulfuric acid solution is equal to or less than 6 cP when the current density is from more than 75 to 100 A/dm$^2$. Particularly when a highly-concentrated sulfuric acid solution is electrolyzed at a high current density using diamond electrodes, the electrolysis process can be carried out highly efficiently while a wear of the electrode is reduced.

10 Claims, 3 Drawing Sheets

US 8,313,637 B2

ELECTROLYSIS METHOD

TECHNICAL FIELD

The present invention relates to a preferred electrolysis method when electrolysis is carried out using various aqueous solutions and solvents as an electrolytic solution, particularly when the electrolysis is carried out at a high current density or when the viscosity of an electrolytic solution is high. An example of electrolysis methods is an electrolysis method used when a resist is removed from a wafer surface by a persulfuric acid solution produced by electrolyzing a sulfuric acid solution in a semiconductor manufacturing process (sometimes referred to as "persulfuric acid method" hereinafter).

BACKGROUND ART

As a method of removing a resist from a wafer surface in a semiconductor manufacturing process, the SPM method (acronym of Sulfuric acid and hydrogen Peroxide Mixture: cleaning method using a mixture of concentrated sulfuric acid and hydrogen peroxide) has conventionally been used widely. However, in the SPM method, hydrogen peroxide is mixed with the cleaning liquid (concentrated sulfuric acid solution) each time when the cleaning liquid is used, and therefore the concentration of the sulfuric acid decreases along with mixing with the hydrogen peroxide. After a certain number of times of the mixing, the oxidization power of the mixture decreases. On such an occasion, the cleaning liquid is to be disposed of, and an increased chemical cost and an environment load pose a problem.

In order to address this problem, a persulfuric acid method compensating the defects of the SPM method is proposed (refer to a patent document 1). The persulfuric acid method generates the persulfuric acid (peroxodisulfuric acid) by electrolyzing a sulfuric acid solution, and a strong oxidization power of the persulfuric acid is used. The persulfuric acid oxidizes and decomposes the resist into $CO_2$ and $H_2O$, and then returns to the sulfuric acid, and recycling is thus realized by returning this liquid to an electrolysis cell. As a result, a higher merit over the SPM method is thus expected in terms of the reduction in the chemical cost and the environment load.

An electrode used for the electrolysis of sulfuric acid is referred to as "diamond electrode", and an electrode manufactured by depositing diamond crystals on a silicon substrate to form a diamond layer in an order of some micrometers to some tens of micrometers, and by implanting (doping) boron thereto for conductivity is usually used. This electrode is used as an anode and a cathode of an electrolysis cell. It is considered that the employment of the diamond electrodes eliminates degradation of the electrodes even at a high current density, resulting in a stable electrolysis process.

Patent document 1: Japanese Patent Application Laid-Open No. 2006-114880

DISCLOSURE OF THE INVENTION

Problems to be Solved by the Invention

However, research conducted by the present inventors has revealed that the diamond layer on the diamond electrode surface gradually wears along with a continuous operation in the persulfuric acid method using the diamond electrodes. For example, when a diamond layer of 50 μm in thickness is present on as the anode surface, the thickness may decrease to a half or a fraction after a continuous operation for 100 hours. This phenomenon occurs only on the anode surface, and does not occur on the cathode surface. A big problem when putting the persulfuric acid method into practical use is that the diamond electrode wears after the operation for a short period of time, since electrode wear greatly affects electrode life, and the diamond electrode is expensive.

The present invention is devised in view of the above-mentioned situation, and has an object of providing an electrolysis method which can electrolyze very efficiently while reducing electrode wear in an electrolysis process.

Means for Solving the Problems

As a result of intensive investigations of causes of the above-mentioned problem which is carried out by the present inventors, the present inventors considers that the diamond electrode wear is caused by employing the highly concentrated sulfuric acid which is an electrolytic solution having a high viscosity and a low ionic dissociation degree, and by supplying an electric power at a very high current density. A specific description thereof is given as follows.

For electrolysis at a predetermined current density, a corresponding number of ions need to move to the anode or the cathode per unit period. When the sulfuric acid solution is electrolyzed, $SO_4^{2-}$ and $HSO_4$ move to the anode, and react on the anode surface, thereby generating $S_2O_8^{2-}$. However, when the current density is high, the supply of sufficient numbers of $SO_4^{2-}$ and $HSO_4^-$ falls short, and carbon atoms on the diamond electrode surface are extracted, and oxidized, thereby generating $CO_3^{2-}$. It is considered that this leads to the wear of the electrode. The moving speed of ions largely depends on the viscosity of the liquid. When the viscosity is low, the ions can easily move in the liquid. The viscosity is a function of the concentration and the temperature. Moreover, as the ion concentration increases, more charges can be carried in case of the same viscosity. The ion concentration depends on the electrolyte concentration and the ionic dissociation, the ionic dissociation depends on the electrolyte concentration and the temperature, and it is thus considered that the ion concentration is a function of the electrolyte concentration and the temperature. The wear of the electrode can thus be avoided by properly managing the concentration and the temperature of the sulfuric acid solution.

Since the viscosity decreases as the sulfuric acid concentration decreases, the wear can be avoided, and also a current efficiency (a quantity of generated persulfuric acid per current quantity) advantageously increases. However, when the sulfuric acid concentration is low, a vapor pressure of the water increases. Therefore, the quantity of vaporized water consequently increases in a resist removing process bath, and such a defect that may cause a trouble in the operation occurs. It is thus important to properly select a combination of the concentration and the temperature. Moreover, though the viscosity decreases as the temperature of the sulfuric acid solution increases, the solution temperature needs to be properly set since a decrease in the electrolysis efficiency and promotion of decomposition of the persulfuric acid are suspect when the temperature is too high. The ion concentration is not always high when the electrolyte concentration is high, but a maximal value exists at a middle concentration. It is thus need to properly set the concentration.

The problem of the electrode wear is a general problem of a electrolysis process. Since the electrode life decreases as the general electrolysis process is carried out at a higher temperature, it is often the case that it is better to carry out the process at a low temperature. However, as to the problem of the electrode wear in the persulfuric acid method, the present inventors have found out a new problem that the viscosity of the sulfuric acid solution increases when the liquid temperature of the sulfuric acid solution is too low, and the electrode wear progresses. As a result, the present invention is achieved.

In other words, an electrolysis method according to a first aspect of the present invention, includes: passing an electrolytic solution through an electrolysis cell including at least a pair of an anode and a cathode; and supplying the electrodes with an electric power, so as to electrolyze the electrolytic solution, wherein the viscosity of the electrolytic solution is set in a range in response to a current density upon the electric power supply to carry out the electrolysis.

An electrolysis method according to a second aspect of the present invention is characterized in that the electrolytic solution is a sulfuric acid solution in the first aspect of the present invention.

An electrolysis method according to a third aspect of the present invention is characterized in that the viscosity of the sulfuric acid solution is equal to or less than 10 cP when the current density is equal to or less than 50 A/dm$^2$ in the second aspect of the present invention.

An electrolysis method according to a fourth aspect of the present invention is characterized in that the viscosity of the sulfuric acid solution is equal to or less than 8 cP when the current density is from more than 50 to 75 A/dm$^2$ in the second aspect of the present invention.

An electrolysis method according to a fifth aspect of the present invention is characterized in that the viscosity of the sulfuric acid solution is equal to or less than 6 cP when the current density is from more than 75 to 100 A/dm$^2$ in the second aspect of the present invention.

An electrolysis method according to a sixth aspect of the present invention is characterized in that the viscosity of the electrolytic solution is controlled by adjusting an electrolyte concentration and a liquid temperature of the electrolytic solution in any of the first to fifth aspect of the present invention.

An electrolysis method according to a seventh aspect of the present invention is characterized in that the electrolyte concentration and a temperature are adjusted so that a coefficient $P_f$ calculated according to the following equation (1) from concentration of ions generated by dissociation of the electrolyte of the electrolytic solution and the viscosity of the electrolytic solution is equal to or more than 1.2 mol/(L·cP) in any of the first to sixth aspects of the present invention.

[Equation 1]

$$P_f = \frac{\sum(zC_b)}{\mu} \quad (1)$$

z: charge number of ion.
$C_b$: ion concentration $$\left(\frac{\text{mol}}{L}\right)$$

$\Sigma(zC_b)$: sum of $zC_b$ of respective ion species.
μ: viscosity (cP).

An electrolysis method according to an eighth aspect of the present invention is characterized in that the anode and the cathode are diamond electrodes in any of the first to seventh aspect of the present invention.

Effects of the Invention

According to the electrolysis method of the present invention, since the viscosity of the electrolytic solution is set in a range in response to a current density upon the electric power supply to carry out the electrolysis in an electrolysis method including: passing an electrolytic solution through an electrolysis cell including at least a pair of an anode and a cathode; and supplying the electrodes with an electric power, so as to electrolyze the electrolytic solution, the electrolysis process can be highly efficiently carried out while an electrode wear is reduced. Particularly when a highly-concentrated sulfuric acid solution is electrolyzed at a high current density using diamond electrodes, the electrolysis process can be carried out highly efficiently while the electrode wear is reduced.

DESCRIPTION OF THE NUMERALS

10 Resist removing device
11 Process bath
12 Circulation line
14 Heater
20 Electrolysis sulfuric acid unit
21 Electrolysis cell
21*a* Anode
21*b* Cathode
21*c* Bipolar electrode
22*a* Liquid feed line
22*b* Liquid return line

BEST MODE FOR CARRYING OUT THE INVENTION

Figure 3:
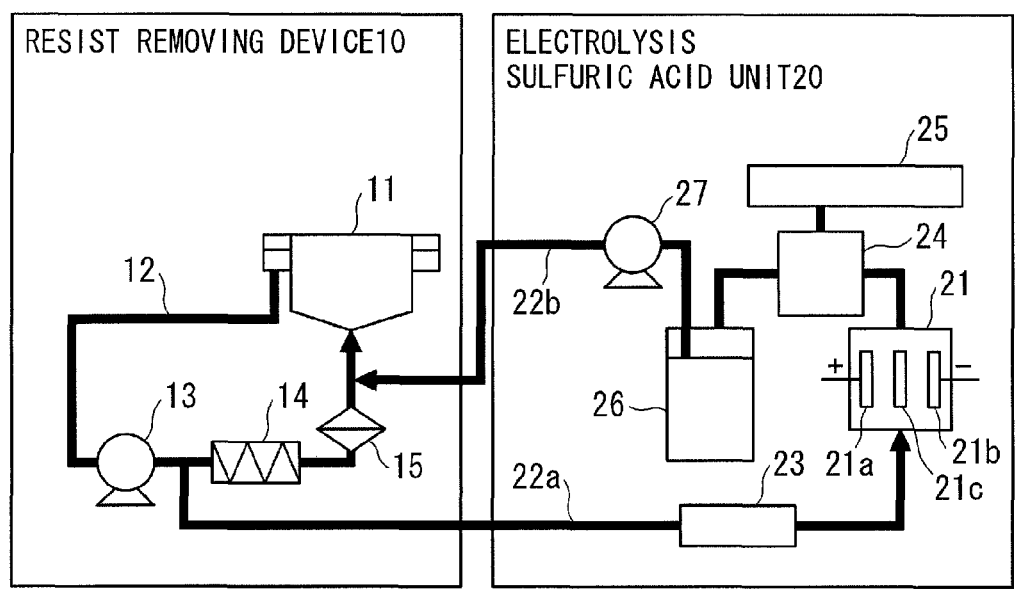
FIG. 3 A diagram showing a cleaning system used for a method according to the embodiment of the present invention.

FIG. 3 shows a flow of a cleaning system which removes and cleans a resist of a semiconductor wafer with a persulfuric acid solution generated by electrolyzing a sulfuric acid solution using diamond electrodes.

The cleaning system is constructed by a combination of a resist removing device 10 and an electrolysis sulfuric acid unit 20. A detailed description thereof will now be given.

The resist removing device 10 includes a process bath 11 which stores a persulfuric acid solution as a cleaning liquid, and into which a semiconductor wafer is inserted for removing resist, and a circulation line 12 on which a pump 13 is interposed is connected to the process bath 11. A heater 14 and a filter 15 are sequentially disposed downstream of the pump 13 on the circulation line 12.

The circulation line branches at between the pump 13 and the heater 14, and a liquid feed line 22*a* for feeding a discharged cleaning liquid to the electrolysis sulfuric acid unit 20 is connected thereto. A liquid return line 22*b* for feeding out the persulfuric acid solution from the electrolysis sulfuric acid unit 20 is connected to and merges with the circulation line 12 downstream of the filter 15.

The electrolysis sulfuric acid unit 20 includes an electrolysis cell 21 for generating persulfuric acid ions by electrolyzing sulfuric acid solution, and the electrolysis cell 21 includes an anode 21a and a cathode 21b constructed by diamond electrodes, and a bipolar electrode 21c disposed between the anode 21a and the cathode 21b. The bipolar electrode 21c is polarized by electric power supply, appearing an anode or a cathode according to electrodes that the bipolar electrode 21c faces, and functions as an anode and a cathode of the present invention.

The liquid feed line 22a is connected to the liquid inlet side of the electrolysis cell 21, and the liquid return line 22b is connected to the liquid outlet side of the electrolysis cell 21. A cooler 23 for cooling solution flowing through the line is interposed on the liquid feed line 22a, and a gas-liquid separator 24, a reservoir 26, and a pump 27 are sequentially interposed on the liquid return line 22b. Moreover, a hydrogen treatment device 25 is connected to the separated gas side of the gas-liquid separator 24.

A description will now be given of a flow of the above-mentioned cleaning system.

A solution having a predetermined sulfuric acid concentration (predetermined electrolyte concentration) is stored in the process bath 11 of the resist removing device 10, and an operation is carried out at from 120° C. to 150° C. in the process bath 11. The solution contains persulfuric acid ions during the cleaning, and the persulfuric acid ions that are generated by electrolyzing the sulfuric acid ions return to the sulfuric acid ions as a result of decomposition. Therefore, the total ion quantities between before and after the electrolysis can be regarded approximately the same, and the electrolyte concentration of the solution can thus be represented by the sulfuric acid concentration.

The temperature of the solution is kept by heating the solution by the heater 14 interposed on the circulation line 12 when the solution is circulated through the circulation line 12. A part of the solution in the circulation line 12 is taken out through the liquid feed line 22a, and is fed to the electrolysis cell 21 via the cooler 23. On this occasion, the solution is cooled to a desired temperature ranging from 40° C. to 70° C. at an outlet of the cooler 23, and reaches the electrolysis cell 21. The branched liquid is electrolyzed by supplying an electric power at a predetermined current density between the anode 21a, and the cathode 21b in the electrolysis cell 21. The electrolysis reaction is a heat-generation reaction, and an outlet temperature of the electrolysis cell 21 generally increases by about 10° C. to 20° C. with respect to an inlet temperature. Therefore when the solution has a viscosity equal to or less than a desired viscosity, namely has a temperature equal to or more than a predetermined temperature at the outlet of the cooler 23 in response to the current density, the viscosity of the solution in the electrolysis cell 21 can be kept to a value equal to or less than a desired value.

The persulfuric acid ions are generated from the sulfuric acid solution by the electrolysis, and are discharged from the electrolysis cell 21 via the return line 22b. Electrolysis gas is generated by the electrolysis reaction in the electrolysis, and fed to the return line 22b along with the solution, a gas-liquid separation is thus carried out by the gas-liquid separator 24, and a separated gas, in particular, hydrogen is treated by the hydrogen treatment device 25. The solution from which the gas is separated by the gas-liquid separator 24 is stored in the reservoir 26, and is returned to the circulation line 12 by the pump 27 according to necessity. This configuration regenerates the persulfuric acid ion consumed in the process bath 11, thereby keeping the persulfuric acid concentration in the cleaning liquid to approximately constant.

The present invention prevents the sulfuric acid concentration from exceeding the predetermined concentration in order to prevent electrode wear. On the other hand, when the sulfuric acid concentration is low, the viscosity of the sulfuric acid solution decreases. Therefore, not only the electrode wear can be avoided, the current efficiency also increases, and a generation efficiency of the persulfuric acid increases. However, when the sulfuric acid concentration is too low, and a vapor pressure of the water increases, the quantity of vaporized water increases in the resist removing process bath, and a defect that may result in a trouble in operation occurs. Moreover, a high sulfuric acid concentration is necessary for the wafer cleaning. There is thus a lower limit for the preferred sulfuric acid concentration of the cleaning liquid.

Moreover, the present invention prevents the liquid temperature of the sulfuric acid solution from decreasing to a temperature equal to or less than the predetermined temperature in order to prevent the electrode wear. Though the viscosity decreases when the temperature of the sulfuric acid solution becomes high, the decrease in the electrolysis efficiency and the promotion of decomposition of the persulfuric acid are concerned when the temperature is too high. There is thus an upper limit for the preferred solution temperature of the electrolytic solution or the cleaning liquid.

The above description of the embodiment is directed particularly to the electrolysis of the sulfuric acid solution using the diamond electrodes. However, when other electrolytic solutions or other electrodes are used, the present invention can be effectively applied, since the electrode wear is expected due to the influence of the viscosity and the ion concentration of the electrolytic solution and the current density.

Though the liquid temperature of the electrolytic liquid is kept in the predetermined range based on the liquid temperature of the sulfuric acid solution to be electrolyzed, namely the liquid temperature of the electrolytic solution, at the electrolysis cell inlet, to be supplied to the electrolysis cell in the above description of the embodiment, the liquid temperature of the electrolytic solution may be maintained based on the liquid temperature of the electrolytic solution discharged from the electrolysis cell.

Sulfuric acid will be cited as an example to explain the relationship of the viscosity with the electrolyte concentration and the solution temperature. After experimentally investigating the conditions of the solution to be electrolyzed without the wear of the electrodes when the sulfuric acid solution is electrolyzed, and the current density is equal to or less than 50 A/dm$^2$ (refer to an example 1 describe later), the investigated conditions are 70 wt % of the sulfuric acid concentration and 30° C. of the liquid temperature, and 86 wt % of the sulfuric acid concentration and 50° C. of the liquid temperature. The viscosity under the above conditions, which are obtained based on the relationship (FIG. 1) of the viscosity with the sulfuric acid concentration and the liquid temperature described in a document(i) are 7.9 cP and 8.5 cP respectively, and it is found out that an electrolysis condition without the electrode wear is equal to or less than 10 cP when the current density is equal to or less than 50 A/dm$^2$.

Figure 1:
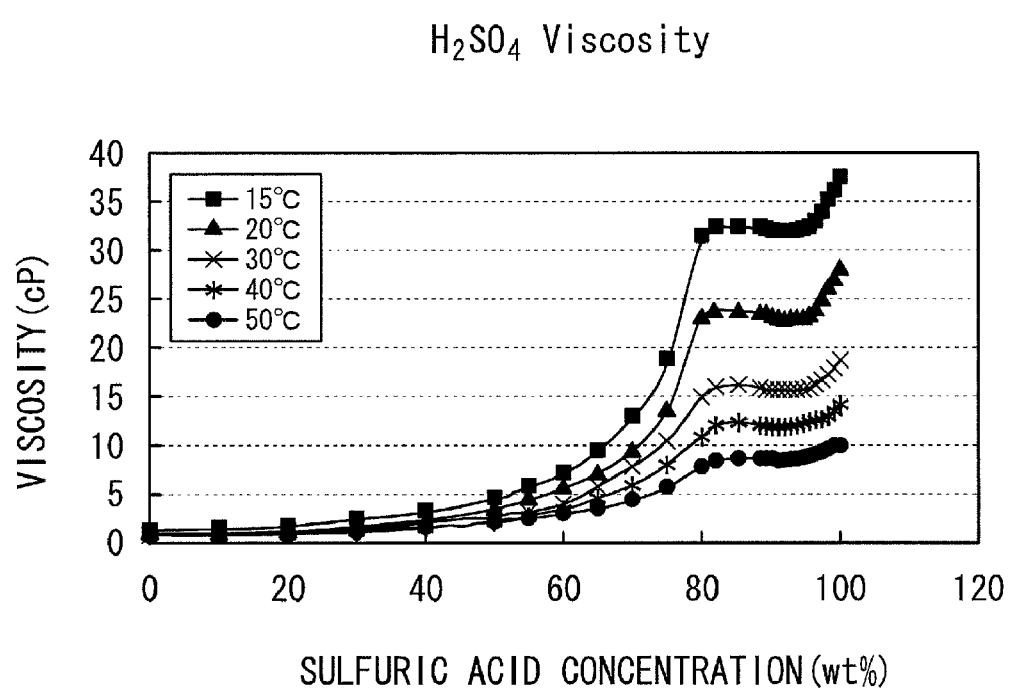
FIG. 1 A chart describing a relationship between a sulfuric acid concentration and a viscosity in a sulfuric acid solution at a predetermined temperature.

A relationship between the sulfuric acid concentration and the liquid temperature required for obtaining a viscosity within this range is thus considered based on FIG. 1. From FIG. 1, when the liquid temperature of the sulfuric acid solution to be electrolyzed is 50° C., the viscosity does not exceed 10 cP even if the sulfuric acid concentration is 80 to 95 wt %, and a possibility of the electrode wear is thus low.

However, from FIG. 1, when the liquid temperature of the sulfuric acid solution is 40° C., the viscosity of the sulfuric acid solution cannot be equal to or less than 10 cP unless the concentration is maintained equal to or less than 78 wt %, and there is a possibility of the electrode wear.

Thus, when the current density is equal to or less than 50 A/dm², the liquid temperature of the sulfuric acid solution is maintained equal to or more than 50° C., or the liquid temperature of the sulfuric acid solution is maintained at from 40 to 50° C., and simultaneously the sulfuric acid concentration is maintained equal to or less than 78 wt %, for example, in order to avoid the risk of the electrode wear.

On the other hand, after experimentally investigating a range of the viscosity of the sulfuric acid solution electrolyzed without electrode wear when the current density is equal to or more than 75 A/dm², the viscosity is equal to or less than 6 cP.

From FIG. 1, when the liquid temperature of the sulfuric acid solution to be electrolyzed is 50° C., the viscosity does not exceed 6 cP, when the sulfuric acid concentration is equal to or less than 75 wt %, and a possibility of the electrode wear is thus low.

Figure 2:
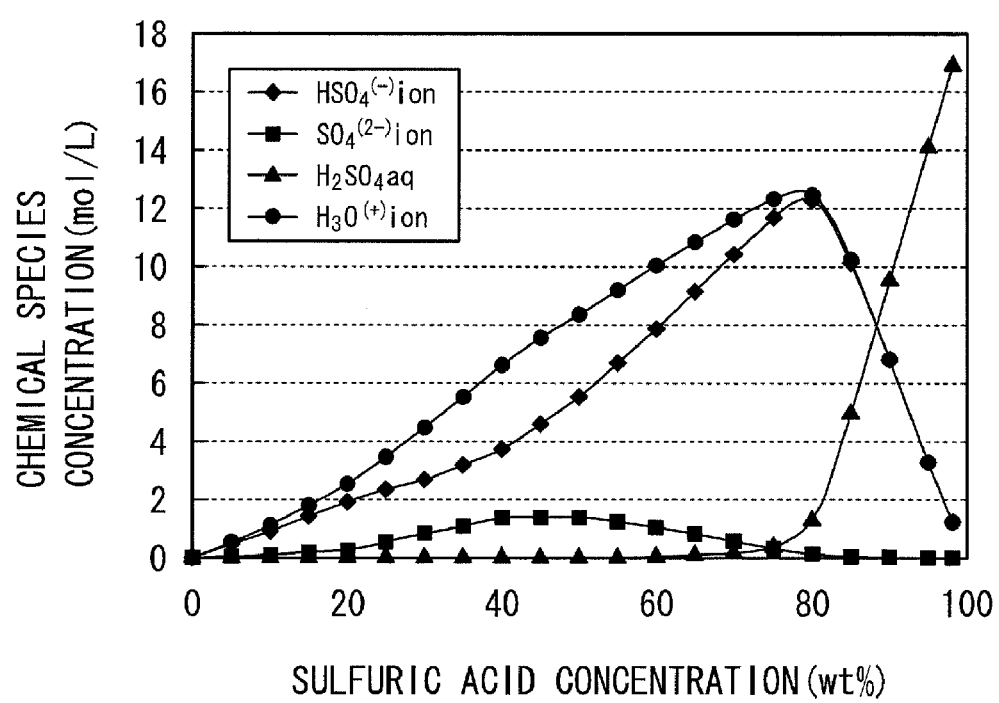
FIG. 2 A chart describing a relationship between a concentration and a dissociation equilibrium in a sulfuric acid solution at 50° C.

In FIG. 1, when the sulfuric acid concentration exceeds about 80 wt %, the viscosity hardly changes. Thus, as long as the viscosity meets the above conditions, the wear can be avoided, even when the concentration increases. However, when the concentration exceeds 85 wt %, a wear is actually observed. This is because when the concentration exceeds 80 wt %, the concentrations of $SO_4^{2-}$ and $HSO_4^-$ decrease sharply as shown in FIG. 2, and sufficient charges are not carried.

It is thus preferred that a parameter in consideration of the ion concentration in addition to the viscosity be used as a reference. The present inventors defined the coefficient $P_f$ as this parameter, and a wear avoiding condition in case of the current density of 50 A/dm² is represented by the following equation (2) based on a result of an electrode durability test.

[Equation 2]

$$\text{Coefficient } P_f = \frac{\sum (zC_b)}{\mu} \geq 1.2 \frac{\text{mol}}{L \cdot cP} \quad (2)$$

In the cases of the current densities 75 or 100 A/dm², $P_f$ is set to $P_f \geq 1.8$ or $P_f \geq 2.4$ (mol/(L·cP)) respectively in proportion to the current density.

The above description is given mainly about the case in which the sulfuric acid is used as the electrolytic solution. However, the present invention is not limited to the electrolysis process of sulfuric acid, and can be similarly applied to electrolysis processes for other applications such as an electrolysis process for an alkaline electrolytic solution for hydrogen production, an electrolysis process for NaCl solution for sodium chlorate production, and an electrolysis process for a waste liquid for waste liquid treatment.

[Method of Calculating Necessary Conditions for Various Current Densities]

When the current density is increased to 75 A/dm², and then to 100 A/dm², a wear will not occur if ion flux can be provided in proportion to the increase. Since the required conditions (limit viscosity and ion concentration) in case of 50 A/dm² are known, the conditions for other current densities can be calculated.

The moving velocity of the ions in the electrolytic solution is generally represented by the following Nernst-Planck equation (3) (document [ii]). The first term on the right side represents ion diffusion due to the difference in concentrations, the second term represents an ion transport by an electrical attraction, and the third term represents an ion transport by convection.

[Equation 3]

$$J = D \times \left(\frac{\partial C}{\partial x}\right) + D \times \frac{CzF}{RT} \times \left(\frac{\partial \phi}{\partial x}\right) + v \times C \quad (3)$$

where
  J: ion flux moving from bulk liquid to an electrode surface (mol/m²/h)
  D: diffusion constant (m²/h)
  C: ion concentration in liquid (mol/m³)
  x: distance in direction perpendicular to an electrode surface (variable) (m)

$$\left(\frac{\partial C}{\partial x}\right)$$

: concentration gradient of ions in x direction (mol/m³/m)
  z: charge number of ions (−)
  F: Faraday constant
  R: gas constant
  T: absolute temperature (K)
  φ: electric potential (V)

$$\left(\frac{\partial \phi}{\partial x}\right)$$

: electric potential difference gradient (V/m), and
  v: flow rate of liquid toward an electrode surface (m/h)

This equation is applied to the transport of the ions in a boundary layer on an electrode surface. Assuming that the concentration gradient is a straight line in the boundary layer, the gradient of potential difference is a straight line between the electrodes, and a flow of the liquid toward the electrode surface is not present in the boundary layer, the equation (3) is represented by the following equation (4).

[Equation 4]

$$J = D \frac{C_b - C_s}{\delta} + z \frac{C_b + C_s}{2} \times \frac{DF}{RT} \times \frac{\phi_+ - \phi_-}{w} \quad (4)$$

where
  $C_b$: ion concentration in bulk liquid (mol/m³)
  $C_s$: ion concentration on electrode surface (mol/m³)
  δ: thickness of boundary layer in relation to material motion on electrode surface (m)
  $\phi_+$: electric potential of anode (V)
  $\phi_-$: electric potential of cathode (V) and
  w: distance between electrodes (m)

It is necessary to know the diffusion constant D in order to calculate J in the equation (4). The diffusion constant of the particles present in the solution is represented by the following Stokes-Einstein equation (5) (document [iii]).

[Equation 5]

$$D = \frac{kT}{6\pi r \mu} \quad (5)$$

where k: Boltzmann constant,
T: absolute temperature,
r: radius of particles, and
μ: viscosity of solution.

If the radius of the ions (particle radius: r) is considered as constant in the equation (5), D is a function of the concentration and the temperature. Moreover, in an experiment carried out by the present inventors, the state of the wear was not improved even if the flow rate (flow quantity) of the liquid passing through the electrolysis cell was increased, and therefore it is considered that influence from the boundary layer thickness δ and the convection term are not so significant, and only the second term, which is a term of the electrical attraction in the equation (4) is dominant. Thus, an index representing how much ion flux can be obtained in the case of the same electric field intensity is represented by the following equation (6).

[Equation 6]

$$\text{Parameter} = z \frac{C_b + C_s}{2} \times \frac{DF}{RT} \quad (6)$$

The following equation is obtained by substituting the equation (5) in the equation 6.

[Equation 7]

$$\text{Parameter} = \frac{kF}{12\pi R} \times \frac{1}{r} \times \frac{z(C_b + C_s)}{\mu} \quad (7)$$

On this occasion, when the equation (7) is simplified based on the following assumptions, an equation (8) is obtained.
1. A radius of an ion representing multiple species of ions is invariant even when the concentration and temperature change.
2. $C_b \gg C_s$

[Equation 8]

$$\text{Parameter} = A \times \frac{\sum (zC_b)}{\mu} \quad (8)$$

where
A: proportional constant.
The new parameter $P_f$ is thus defined as the following equation (1).

[Equation 9]

$$P_f = \frac{\sum (zC_b)}{\mu} \quad (1)$$

z: charge number of ion.
$C_b$: ion concentration $$\left(\frac{\text{mol}}{L}\right)$$

$\Sigma(zC_b)$: sum of $zC_b$ of respective ion species.
μ: viscosity (cP).

The $P_f$'s calculated from the ion concentrations of $SO_4^{2-}$ and $HSO_4^-$ and solution viscosity by the equation (1) at various sulfuric acid concentrations and the temperatures are represented in a Table 1.

TABLE 1

| | Ion Flux Parameter $P_f$(mol/L/cP) | | | | | | |
|---|---|---|---|---|---|---|---|
| Temperature | Sulfuric acid concentration (wt %) | | | | | | |
| (° C.) | 60 | 65 | 70 | 75 | 80 | 85 | 90 |
| 20 | 1.876 | 1.572 | 1.240 | 0.917 | 0.566 | 0.456 | 0.310 |
| 30 | 2.524 | 1.921 | 1.507 | 1.194 | 0.853 | 0.660 | 0.450 |
| 40 | 2.983 | 2.420 | 1.937 | 1.547 | 1.194 | 0.841 | 0.579 |
| 50 | 3.639 | 3.068 | 2.787 | 2.101 | 1.629 | 1.203 | 0.788 |
| 60 | 3.106 | 2.798 | 2.578 | 2.383 | 2.136 | 1.551 | 0.918 |

From experiments carried out by the present inventors, the wear is nearly avoided in the case of 50 A/dm² under the condition of 85 wt % and 50° C. and it is thus considered that a condition $P_f \geq 1.2$ represents a safe zone. Since the current density and the ion flux are in a proportional relationship to each other, conditions $P_f \geq 1.8$ and $P_f \geq 2.4$ (mol/(L·cP)) are safe zones, namely wear avoiding conditions, in the cases of current densities 75 and 100 A/dm², respectively.

Document [i]) "Ryuusan Kougaku (Sulfuric Acid Engineering)", written by Shouichirou HORI/Shikazou NAKAGAWA, published by Kigensha Shuppan Co., Ltd (Kigensha Publisher Co., Ltd), pp. 590 (1959) Document [ii]) "Ion-Exchange Membrane Separation Processes", Membrane Science and Technology Series, 9, H. Strathmann, Elsevier, pp. 70 (2004) Document [iii]) "Perry's Chemical Engineer's Handbook", 7th Edition, pp. 5-50 McGraw-Hill (1997)

EXAMPLE 1

The following examples were carried out using the cleaning system according to the first embodiment.

Comparative Example 1

Since the current efficiency is higher when the electrolysis process temperature is lower, the operation was carried out with the electrolysis cell with the liquid temperature at the electrolysis cell inlet kept at 30° C. Other conditions are described below.

(Electrode shape/dimension=150 mm diameter, current density=50 A/dm², solution concentration=86 wt %, and flow rate 0.86 L/min)

As a result, a wear was observed on the anode surface after 50 hours have passed from the start of the operation, and deformation of crystal particles and a reduction of the diamond layer thickness were observed by a microscope.

Example 1

The temperature and the concentration were changed with respect to the comparative example 1 to perform an experiment. The conditions are described below.

(Electrode shape/dimension=150 mm diameter, current density=50 A/dm², and flow rate 0.86 L/min)

Presences/absences of the wear after 50 hours from the start of the operation, together with the data of the comparative example 1 were compared with each other described in a table 2. Based on the experimental results shown in the table 2, it is determined that the wear of the electrode can be avoided by selecting the concentration and the temperature so that the solution viscosity is approximately equal to or less than 10 cP in case of the current density=50 A/dm².

TABLE 2

| Temperature (° C.) | Sulfuric acid concentration (wt %), viscosity is in parentheses (cP) | |
|---|---|---|
| | 70 | 86 |
| 30 | ○ (7.9) | X (16.0) |
| 40 | — (6.1) | Δ (12.3) |
| 50 | — (4.2) | ○ (8.5) |

Graph legend:
○ = good,
Δ = slight wear,
X = wear, and
— = no data

Though further experiments are necessary for proving that the electrode is good over a long period, no differences between before and after the experiment were observed under the conditions denoted by "○" (good) when worn thicknesses were measured in the above experiment. Even if the wear is 1 μm, the electrode has a durable period equal to or more than 2500 hours, since the initial diamond thickness is 50 μm. It is considered that the electrode can be used even for a longer period in practice. Moreover, when the parameter $P_f$ is applied to the same experimental result, a table 3 is obtained. From the table 2 and table 3, it is appreciated that a necessary condition for avoiding a wear in case of 50 A/dm² is $P_f \geq 1.2$ (mol/(L·cP)).

TABLE 3

| | Ion Flux Parameter $P_f$ (mol/L/cP) | |
|---|---|---|
| | Sulfuric acid concentration (wt %) | |
| Temperature (° C.) | 70 | 86 |
| 30 | 1.507 | 0.633 |
| 40 | 1.937 | 0.807 |
| 50 | 2.787 | 1.146 |

EXAMPLE 2

Conditions which provide 75/50=1.5 times and 100/50=2.0 times of the ion fluxes when the current densities are 75 A/dm² and 100 A/dm² respectively in the example 1 are calculated using the Nernst-Planck equation and Stokes-Einstein equation, and are shown in a table 4. Moreover, it is more preferable that $P_f \geq 1.8$ and $P_f \geq 2.4$ (mol/(L·cP)) using the parameter $P_f$ are set as the conditions for avoiding wear, in case of the current densities of 75 and 100 A/dm², respectively.

In other words, it is apparent that the solution viscosity needs to be decreased, or the ion concentration needs to be increased when the current density is high.

TABLE 4

| Current density (A/dm²) | Viscosity condition |
|---|---|
| 75 | Equal to or less than 8 cP, more preferably equal to or less than 6 cP |
| 100 | Equal to or less than 6 cP, more preferably equal to less than 4.5 cP |

The invention claimed is:

1. An electrolysis method, comprising:

passing an electrolytic sulfuric acid solution through an electrolysis cell including at least a pair of an anode and a cathode diamond electrode; and supplying each of the diamond electrodes with electric power, so as to electrolyze the electrolytic solution, wherein the viscosity of the electrolytic solution is set in a range of equal to or less than 10 cP when the electric power supplies a current density equal or less than 50 A/dm² to carry out the electrolysis.

2. The electrolysis method according to claim 1, wherein the viscosity of the electrolytic solution is controlled by adjusting an electrolyte concentration and a liquid temperature of the electrolytic solution.

3. The electrolysis method according to claim 2, wherein the electrolyte concentration and the liquid temperature of the electrolytic solution are adjusted so that a coefficient $P_f$ calculated according to the following equation (1) from an concentration of ions generated by dissociation of the electrolyte of the electrolytic solution and the viscosity of the electrolytic solution is equal to or more than 1.2 mol/(L·cP),

[Equation 1]

$$P_f = \frac{\sum (zC_b)}{\mu} \quad (1)$$

z: charge number of ion $C_b$: ion concentration $$\left(\frac{mol}{L}\right)$$

$\Sigma(zC_b)$: sum of $zC_b$ of respective ion species

μ: viscosity (cP).

4. The electrolysis method according to claim 1, wherein the electrolyte concentration and the liquid temperature of the electrolytic solution are adjusted so that a coefficient $P_f$ calculated according to the following equation (1) from an concentration of ions generated by dissociation of the electrolyte of the electrolytic solution and the viscosity of the electrolytic solution is equal to or more than 1.2 mol/(L·cP),

[Equation 1]

$$P_f = \frac{\sum (zC_b)}{\mu} \quad (1)$$

z: charge number of ion.

$C_b$: ion concentration $$\left(\frac{\text{mol}}{L}\right)$$

$\Sigma(zC_b)$: sum of $zC_b$ of respective ion species
$\mu$: viscosity (cP).

5. An electrolysis method, comprising:

passing an electrolytic sulfuric acid solution through an electrolysis cell including at least a pair of an anode and a cathode diamond electrode; and supplying each of the diamond electrodes with electric power, so as to electrolyze the electrolytic solution, wherein the viscosity of the sulfuric acid electrolytic solution is set in a range of equal to or less than 8 cP when the electric power supplies a current density over 50 A/dm² but not more than to 75 A/dm².

6. The electrolysis method according to claim 5, wherein the viscosity of the electrolytic solution is controlled by adjusting an electrolyte concentration and a liquid temperature of the electrolytic solution.

7. The electrolysis method according to claim 5, wherein the electrolyte concentration and the liquid temperature of the electrolytic solution are adjusted so that a coefficient $P_f$ calculated according to the following equation (1) from an concentration of ions generated by dissociation of the electrolyte of the electrolytic solution and the viscosity of the electrolytic solution is equal to or more than 1.2 mol/(L·cP),

[Equation 1]

$$P_f = \frac{\sum (zC_b)}{\mu} \qquad (1)$$

z: charge number of ion
$C_b$: ion concentration $$\left(\frac{\text{mol}}{L}\right)$$

$\Sigma(zC_b)$: sum of $zC_b$ of respective ion species
$\mu$: viscosity (cP).

8. An electrolysis method, comprising:

passing an electrolytic sulfuric acid solution through an electrolysis cell including at least a pair of an anode and a cathode diamond electrode; and supplying each of the diamond electrodes with electric power, so as to electrolyze the electrolytic solution, wherein the viscosity of the sulfuric acid electrolytic solution is set in a range of equal to or less than 6 cP when the electric power supplies a current density over 75 A/dm² but not more than to 100 A/dm².

9. The electrolysis method according to claim 8, wherein the viscosity of the electrolytic solution is controlled by adjusting an electrolyte concentration and a liquid temperature of the electrolytic solution.

10. The electrolysis method according to claim 8, wherein the electrolyte concentration and the liquid temperature of the electrolytic solution are adjusted so that a coefficient $P_f$ calculated according to the following equation (1) from an concentration of ions generated by dissociation of the electrolyte of the electrolytic solution and the viscosity of the electrolytic solution is equal to or more than 1.2 mol/(L·cP),

[Equation 1]

$$P_f = \frac{\sum (zC_b)}{\mu} \qquad (1)$$

z: charge number of ion
$C_b$: ion concentration $$\left(\frac{\text{mol}}{L}\right)$$

$\Sigma(zC_b)$: sum of $zC_b$ of respective ion species
$\mu$: viscosity (cP).

* * * * *